(12) United States Patent
Jang et al.

(10) Patent No.: US 9,111,807 B2
(45) Date of Patent: Aug. 18, 2015

(54) THIN FILM TRANSISTOR SUBSTRATE

(71) Applicant: LG DISPLAY CO., LTD., Seoul (KR)

(72) Inventors: Hun Jang, Paju-si (KR); Joon Young Yang, Bucheon-si (KR); Gyu Tae Kang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 10 days.

(21) Appl. No.: 14/084,283

(22) Filed: Nov. 19, 2013

(65) Prior Publication Data

US 2014/0138691 A1    May 22, 2014

(30) Foreign Application Priority Data

Nov. 19, 2012  (KR) .................. 10-2012-0131213

(51) Int. Cl.
*H01L 27/12* (2006.01)
*H01L 27/16* (2006.01)

(52) U.S. Cl.
CPC .......... *H01L 27/124* (2013.01); *H01L 27/1222* (2013.01)

(58) Field of Classification Search
CPC ... H01L 27/12; H01L 27/124; H01L 27/1222; H01L 27/3253; H01L 27/3263; H01L 27/16; H01L 29/41733; H01L 29/42384; H01L 29/78696
See application file for complete search history.

(56) References Cited

U.S. PATENT DOCUMENTS

| | | | | |
|---|---|---|---|---|
| 6,953,976 | B2 * | 10/2005 | Kido | 257/401 |
| 8,368,674 | B2 * | 2/2013 | Kim et al. | 345/205 |
| 8,372,686 | B2 * | 2/2013 | Yamada et al. | 438/99 |
| 2002/0000557 | A1 * | 1/2002 | Kido | 257/66 |
| 2004/0099865 | A1 * | 5/2004 | Tak et al. | 257/72 |
| 2004/0125262 | A1 * | 7/2004 | Cho et al. | 349/43 |
| 2005/0056847 | A1 * | 3/2005 | Nakamura et al. | 257/72 |
| 2005/0092994 | A1 * | 5/2005 | Ishige | 257/72 |
| 2005/0128409 | A1 * | 6/2005 | Lee | 349/141 |
| 2005/0139824 | A1 * | 6/2005 | Park | 257/40 |
| 2006/0033446 | A1 * | 2/2006 | Kim et al. | 315/169.3 |
| 2007/0165171 | A1 * | 7/2007 | Lee | 349/139 |
| 2008/0079892 | A1 * | 4/2008 | Fujikawa et al. | 349/156 |
| 2011/0012203 | A1 * | 1/2011 | Jeong et al. | 257/351 |

* cited by examiner

*Primary Examiner* — Thomas L Dickey
*Assistant Examiner* — Fazli Erdem
(74) *Attorney, Agent, or Firm* — Brinks Gilson & Lione

(57) ABSTRACT

A thin film transistor substrate includes: pluralities of gate lines and data lines arranged to define a plurality of pixel regions, and a plurality of thin film transistors formed on the pixel regions in such a manner as to include first and second thin film transistors connected to the same gate line and the pixel regions adjacent to each other. Each of the first and second thin film transistors includes: a gate electrode connected to the gate line; a semiconductor layer formed on the gate line in an octagon shape; a source electrode connected to the data line; and a drain electrode formed in an opposite shape to the source electrode.

20 Claims, 7 Drawing Sheets

THIN FILM TRANSISTOR SUBSTRATE

The present application claims priority under 35 U.S.C. §119(a) to Korean Patent Application No. 10-2012-0131213 filed on Nov. 19, 2012, which is hereby incorporated by reference in its entirety.

BACKGROUND

1. Field of the Disclosure

The present disclosure relates to an organic light emitting display device.

2. Description of the Related Art

With the development of an information society, the requirements for display devices have been increased in a variety of manners. In accordance therewith, a variety of flat panel display devices have been researched. The flat panel display devices include liquid crystal display (LCD) devices, plasma display devices (PDPs), electro luminescent display (ELD) devices, vacuum fluorescent display (VFD) devices and so on. Some of the flat display devices are being used in several apparatuses as display devices.

Among the flat panel display devices, the LCD devices are now widely used as portable image display devices in place of cathode ray tubes (CRTs), because of features such as superior image quality, light weight, slimness and low power consumption. Actually, the LCD devices are being developed in a variety of manners. The developed LCD devices are being used in portable devices such as notebooks, television receivers configured to receive and display broadcast signals and desk top computers, as monitors.

FIG. 1 is a planar view showing a thin film transistor substrate of an LCD device according to the related art.

Referring to FIG. 1, a gate line 21 and a data line 31 crossing the gate line 21 are formed on the thin film transistor substrate of the LCD device according to the related art.

A pixel region is defined by the gate and data lines 21 and 31 crossing each other. A thin film transistor T is formed in the pixel region.

The thin film transistor T includes a gate electrode 22, a source electrode 32 and a drain electrode 33. The gate electrode 22 can be formed in a single body united with the gate line 21. The data line 31 can be used as a source electrode 32. The drain electrode 33 can be formed in a shape of "I" running parallel to the data line 21.

A pixel electrode 40 is formed on the pixel region. The pixel electrode 40 can be electrically connected to one end of the drain electrode 33 via a pixel contact hole 50.

The drain electrode 33 partially overlaps with the gate electrode 22. Due to this, a parasitic capacitor Cgd is formed.

FIG. 2 is a waveform diagram illustrating a voltage of a drain electrode of the thin film transistor (i.e., a voltage of the pixel electrode), which is varied by the parasitic capacitor Cgd.

In FIG. 2, a feed through voltage ΔVp corresponds to a difference between a data voltage Vd and a charge voltage Vlc of a liquid crystal cell Clc.

$$\Delta V_p = \frac{C_{gd}}{C_{gd}+C_{lc}+C_{st}}\Delta V_g \quad \text{[Equation 1]}$$

In the equation 1, "ΔVg" is a difference between a gate high voltage Vgh and a gate low voltage Vgl, and "Cst" is a storage capacitor.

The feed through voltage ΔVp increases as the parasitic capacitor Cgd is enlarged. Due to this, the charge voltage of the liquid crystal cell Clc cannot reach the data voltage Vd.

SUMMARY

According to a first general aspect, a thin film transistor substrate includes: pluralities of gate lines and data lines arranged to define a plurality of pixel regions; and a plurality of thin film transistors formed on the pixel regions in such a manner as to include first and second thin film transistors connected to the same gate line and the pixel regions adjacent to each other. Each of the first and second thin film transistors includes: a gate electrode connected to the gate line; a semiconductor layer formed on the gate line in an octagon shape; a source electrode connected to the data line; and a drain electrode formed in an opposite shape to the source electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
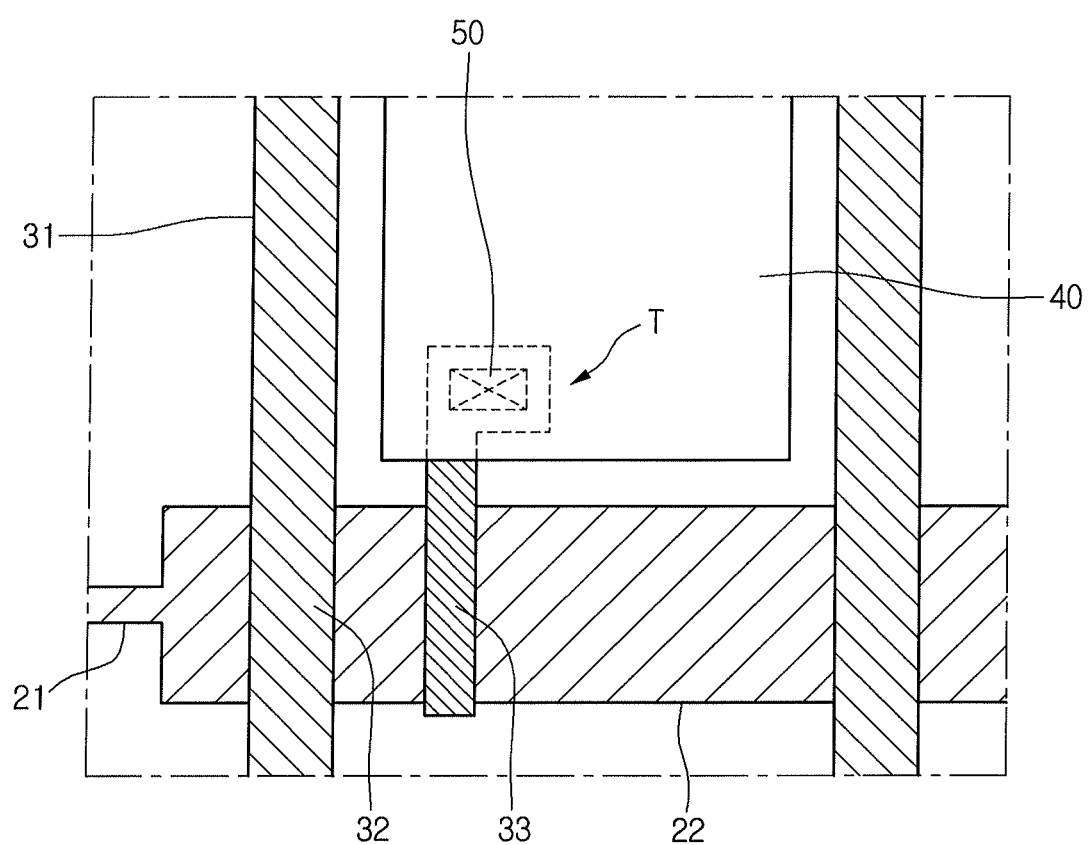
FIG. 1 is a planar view showing a thin film transistor substrate of an LCD device according to the related art.
Figure 2:
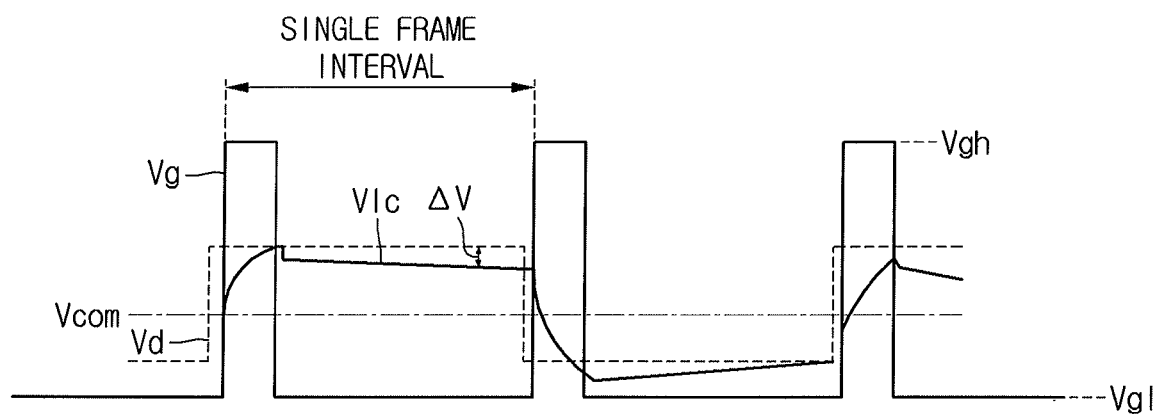
FIG. 2 is a waveform diagram illustrating a voltage of a drain electrode of the thin film transistor (i.e., a pixel voltage) which is varied by the parasitic capacitor Cgd.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

A thin film transistor substrate according to an embodiment of the present disclosure can include pluralities of gate lines and data lines arranged to define a plurality of pixel regions, and a plurality of thin film transistors formed on the pixel regions in such a manner as to include first and second thin film transistors connected to the same gate line and the pixel regions adjacent to each other. Each of the first and second thin film transistors can include: a gate electrode connected to the gate line; a semiconductor layer formed on the gate line in an octagon shape; a source electrode connected to the data line; and a drain electrode formed in an opposite shape to the source electrode.

The semiconductor layers of the first and second thin film transistors can be formed in the same size.

The gate electrode can be formed in the same shape as and a larger size than the semiconductor layer.

The gate electrode can be formed at an intersection of the gate line and the data line.

The source electrode can be formed in a half elliptical shape by being bent from the data line.

The drain electrode can include an end portion formed in a parallel structure to the source electrode.

The semiconductor layer can be bilaterally symmetrical about the data line.

The first and second thin film transistors have alternate shapes with each other.

The source electrode is formed in a single body united with the data line, and the gate electrode is formed in a single body united with the gate line.

The source electrode can include: a first source electrode portion parallel to the data line; a second source electrode portion inclined at an acute angle and configured to connect the data line to the first source electrode portion; and a third source electrode portion inclined at the acute angle and configured to connect the data line to the first source electrode portion.

The end portion of the drain electrode includes: a first edge parallel to the first source electrode portion; a second edge parallel to the second source electrode portion; and a third edge parallel to the third source electrode portion.

A thin film transistor substrate according to a second general aspect of the present embodiment includes: pluralities of gate lines and data lines arranged to define a plurality of pixel regions; and a plurality of thin film transistors formed on the pixel regions. The pixel regions can are scanned in such a manner that the pixel regions of odd-numbered columns are selected alternately with those of even-numbered columns in two rows as the gate lines are sequentially enabled.

Figure 3:
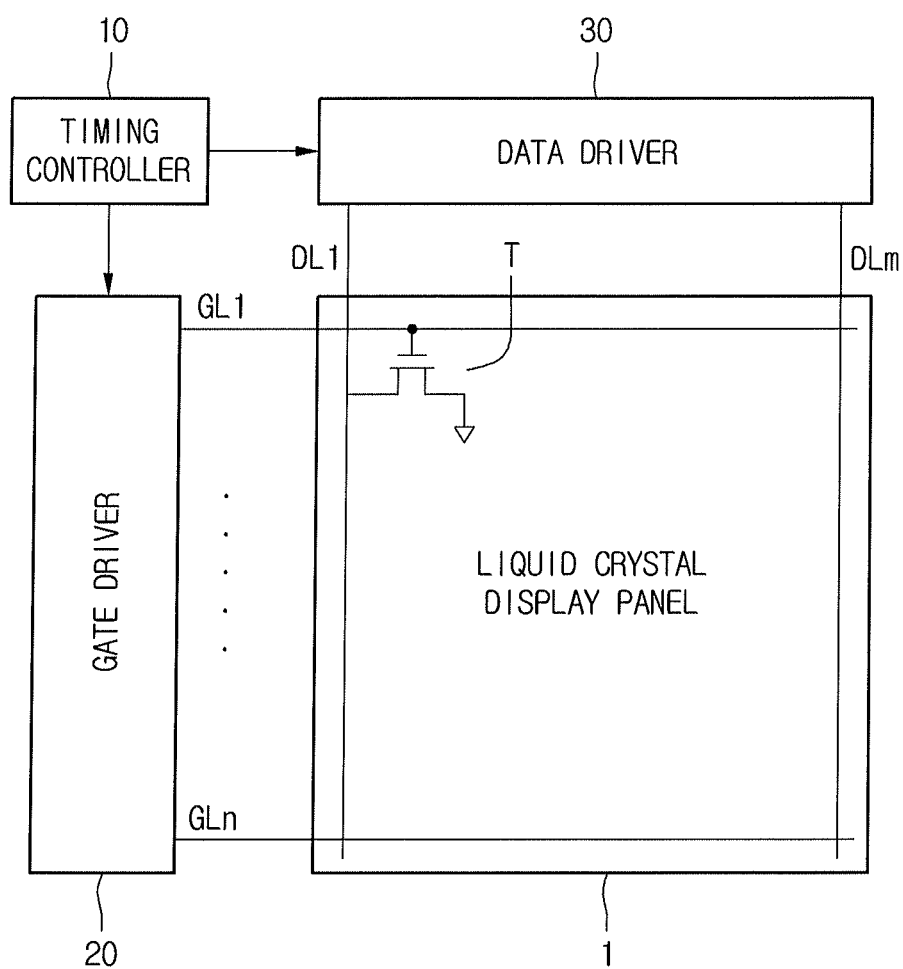
FIG. 3 is a block diagram showing an LCD device according to an embodiment of the present disclosure.

FIG. 3 is a block diagram showing an LCD device according to an embodiment of the present disclosure.

Referring to FIG. 3, the LCD device according to an embodiment of the present disclosure can include an LCD panel 1, a timing controller 10, a gate driver 20 and a data driver 30.

The LCD panel 1 can include a plurality of gate lines GL1~GLn and a plurality of data line DL1~DLm formed in a direction crossing the gate lines GL1~GLn. A plurality of pixel regions can be defined by the plurality of gate lines GL1~GLn and the plurality of data line DL1~DLm. A thin film transistor T can be formed in each of the pixel regions. The thin film transistor T can be electrically connected to one of the gate lines GL1~GLn and one of the data lines DL1~DLm. Such an LCD panel 1 can be driven in one of plural inversion modes by the data driver 30.

The thin film transistor T can be turned-on by a gate signal applied through one of the gate lines GL1~GLn. When the thin film transistor T is turned on, a data voltage on one of the data line DL1~DLm can be transferred to a pixel electrode. An electric field can be generated by a potential difference between the voltage on the pixel electrode and a common voltage. The electric field makes liquid crystal molecules to be displaced (or re-aligned). As such, brightness of light penetrating from a backlight through a liquid crystal layer can be adjusted. In accordance therewith, an image can be displayed.

The timing controller 10 can externally receive video data RGB, a horizontal synchronous signal H, a vertical synchronous signal V and a clock signal CLK. Also, the timing controller 10 can derive gate control signals GDC and data control signals DDC from the horizontal and vertical synchronous signals H and V and the clock signal CLK. The gate control signals GDC are used to control the gate driver 20. The data control signals DDC are used to control the data driver 30.

The gate driver 20 can include a shift register, a level shifter array and an output buffer array. The shift register replies to the gate control signals GDC from the timing controller 10 and sequentially generates scan pulses. The level shifter array is configured to level-shift the plurality of scan pulses sequentially generated in the shift register into a voltage level which is required to drive the liquid crystal cells. The output buffer array buffers the level-shifted scan pulses and outputs the buffered scan pulses as gate signals. Such a gate driver 20 sequentially applies the gate signals to the gate lines GL1~GLn. As such, the thin film transistors T connected to the gate lines GL1~GLn are sequentially turned-on in a single line. Also, the liquid crystal cells can be selected in a single horizontal line in order to each receive the data voltage. In accordance therewith, the data voltages generated in the data driver 30 can be applied to a single horizontal line of liquid crystal cells which are selected by the gate signal.

The data driver 30 samples the video data RGB applied from the timing controller 10 and latches the sampled video data RGB. Also, the data driver 30 converts the latched video data into the data voltages.

Such a gate driver 20 can be implemented by at least one integrated circuit chip. Similarly, the data driver 30 can be implemented by at least one data integrated circuit chip.

Figure 4:
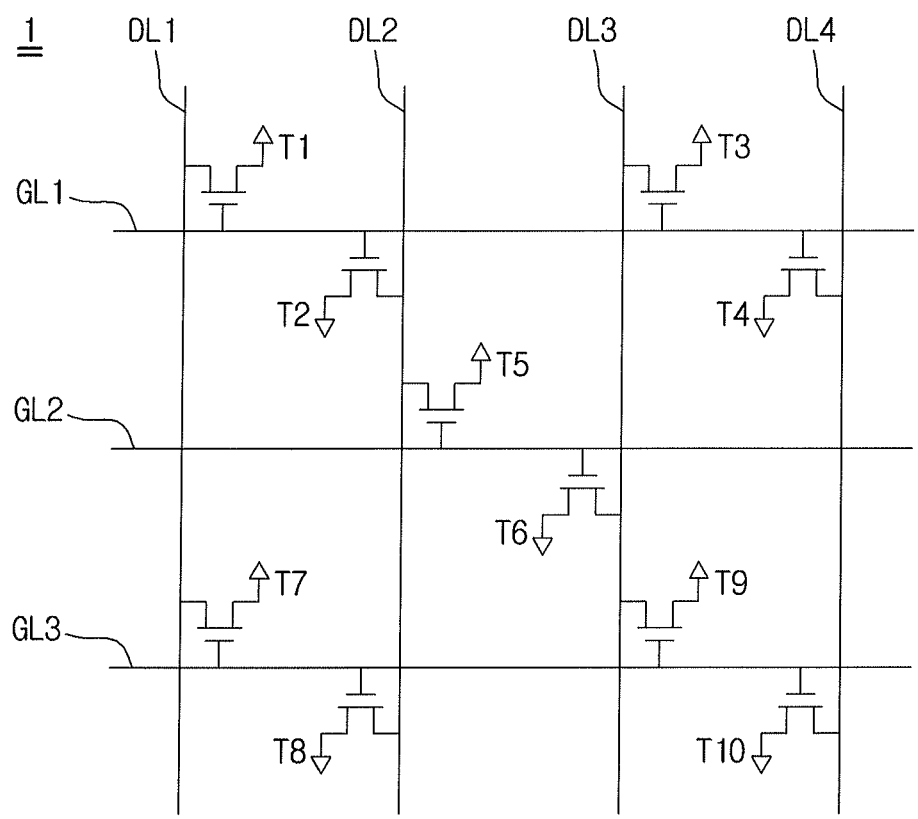
FIG. 4 is a circuit diagram showing the layout of a thin film transistor substrate of an LCD device according to a first embodiment of the present disclosure.

FIG. 4 is a circuit diagram showing the layout of a thin film transistor substrate of an LCD device according to a first embodiment of the present disclosure.

Referring to FIG. 4, the thin film transistor substrate of the LCD device according to a first embodiment of the present disclosure can include first through tenth thin film transistors T1~T10. Although the first through tenth thin film transistors T1~T10 as well as first through third gate lines GL1~GL3 and first through fourth data lines DL1~DL4 connected to the thin film transistors T1~T10 are shown in FIG. 4, the present embodiment is not limited to these. The number of thin film transistors, the number of gate lines and the number of data lines depend upon the definition of the LCD device. In accordance therewith, the number of thin film transistors, the number of gate lines and the number of data lines are not limited to those in FIG. 4.

Among the thin film transistors T1~T10, the thin film transistors of odd-numbered rows and the thin film transistors of even-numbered rows adjacent to each other can be formed in alternate shapes (or half turned shapes or half span shapes) with the respective gate line as central axes. The thin film transistors of the odd-numbered rows and the thin film transistors of the even-numbered rows can be connected to the same gate line.

Also, the thin film transistors in each of the odd-numbered columns can be arranged one alternately with one another in such a manner as to be shared to the odd-numbered gate lines in a single pair and connected to the odd-numbered gate lines in a single pair. Similarly, the thin film transistors in each of the even-numbered columns can be arranged alternately with one another in such a manner as to be shared to the even-numbered gate lines in a single pair and can be connected to the even-numbered gate lines in a single pair.

For example, the first thin film transistor T1 and the second thin film transistor T2 can be formed to have the alternate shapes (or half turned shapes or half span shapes) with each other in the first gate line GL1 and commonly connected to the first gate line GL1. The third and fourth thin film transistors T3 and T4 can be formed to have the alternate shapes (or half turned shapes or half span shapes) with each other in the first gate line GL1 and commonly connected to the first gate line GL1. The fifth and sixth thin film transistors T5 and T6 can be formed to have the alternate shapes (or half turned shapes or half span shapes) with each other in the second gate line GL2 and commonly connected to the second gate line GL2. The seventh and eighth thin film transistors T7 and T8 can be formed to have the alternate shapes (or half turned shapes or half span shapes) with each other in the third gate line GL3 and commonly connected to the third gate line GL3. The ninth and tenth thin film transistors T9 and T10 can be formed to have the alternate shapes (or half turned shapes or half span shapes) with each other in the third gate line GL3 and commonly connected to the third gate line GL3.

More specifically, the first thin film transistor T1 can be electrically connected to the first gate line GL1 and the first data line DL1. The second thin film transistor T2 can be electrically connected to the first gate line GL1 and the second gate line DL2. The third thin film transistor T3 can be electrically connected to the first gate line GL1 and the third data line DL3. The fourth thin film transistor T4 can be electrically connected to the first gate line GL1 and the fourth data line DL4. The fifth thin film transistor T5 can be electrically connected to the second gate line GL2 and the second data line DL2. The sixth thin film transistor T6 can be electrically connected to the second gate line GL2 and the third data line DL3. The seventh thin film transistor T7 can be electrically connected to the third gate line GL3 and the first data line DL1. The eighth thin film transistor T8 can be electrically connected to the third gate line GL3 and the second data line DL2. The ninth thin film transistor T9 can be electrically connected to the third gate line GL3 and the third data line DL3. The tenth thin film transistor T10 can be electrically connected to the third gate line GL3 and the fourth data line DL4.

The thin film transistors T1~T10 are disposed in pixel regions which are defined by the gate lines GL1~GL3 and the data lines DL1~DL4. The pixel regions can be scanned in such a manner that the pixel regions of the odd-numbered columns are selected alternately with those of the even-numbered columns in two rows as the gate lines are sequentially enabled.

To this end, the first through tenth thin film transistors T1~T10 can be sequentially driven in two rows as the gate lines GL1~GL3 is sequentially enabled by the gate signals. More specifically, the first through fourth thin film transistors T1~T4 are turned-on when the first gate line GL1 is enabled. The fifth and sixth thin film transistors T5 and T6 are turned-on when the second gate line GL2 is enabled. The seventh through tenth thin film transistor T7~T10 are turned-on when the third gate line GL3 is enabled.

In this way, the two pixel regions adjacent to each other in a top-bottom direction can be simultaneously scanned. As such, the charge voltage of a liquid crystal cell within a pixel region can be little affected with those of the liquid crystal cells within the adjacent pixel regions. In accordance therewith, the feed through voltage ΔVp can decrease. As a result, the image quality can be enhanced.

Figure 5:
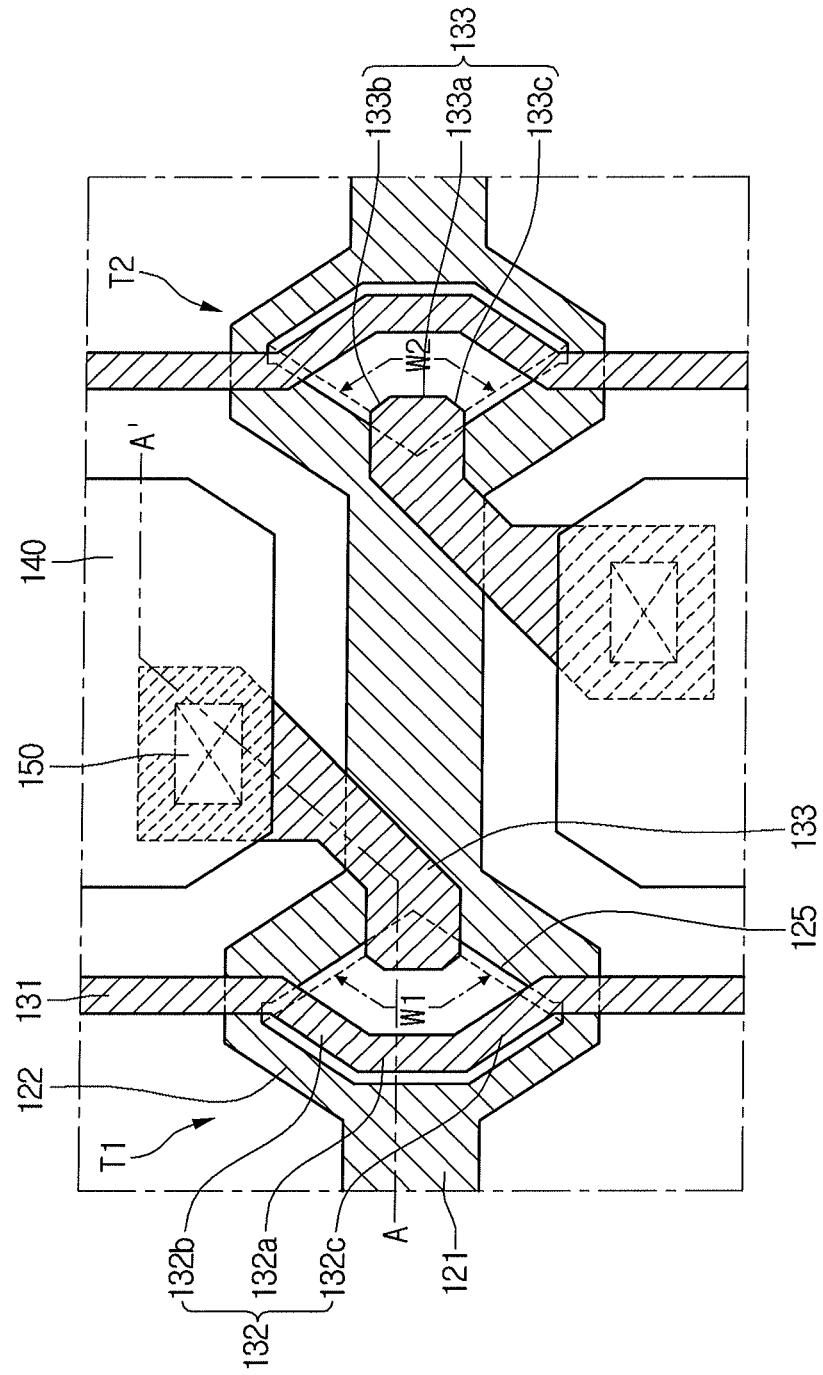
FIG. 5 is a planar view showing a thin film transistor substrate of an LCD device according to a first embodiment of the present disclosure.
Figure 6:
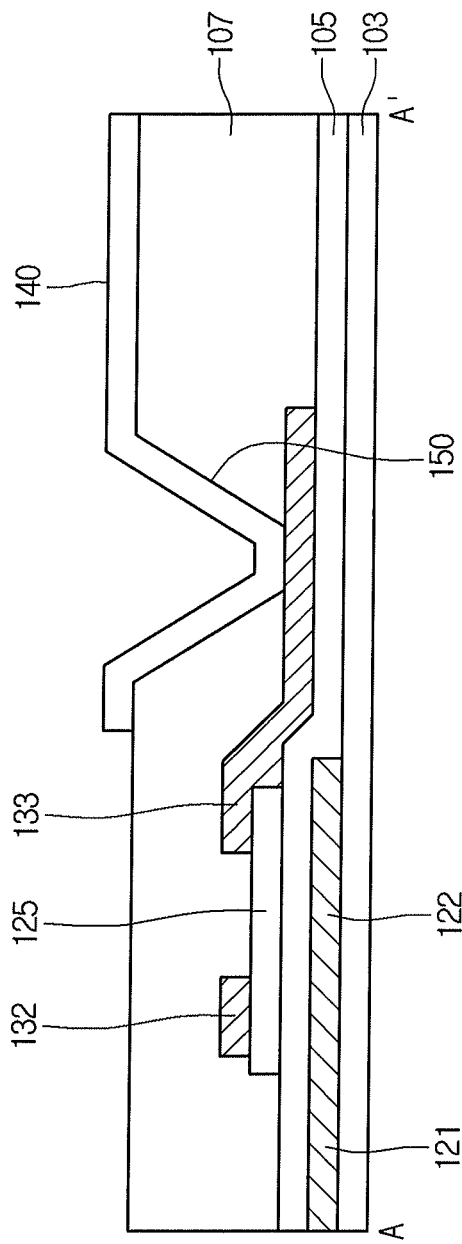
FIG. 6 is a cross-sectional view showing the thin film transistor substrate of the LCD device taken along a line A-A' in FIG. 5.

FIG. 5 is a planar view showing a thin film transistor substrate of an LCD device according to a first embodiment of the present disclosure. FIG. 6 is a cross-sectional view showing the thin film transistor substrate of the LCD device taken along a line A-A' in FIG. 5.

As shown in FIG. 5, a thin film transistor of an odd-numbered row and another thin film transistor of an even-numbered row can be formed on the thin film transistor substrate. For the convenience of explanation, the first and second thin film transistors T1 and T2 will be referred to as the thin film transistors of the odd-numbered and even-numbered rows.

Referring to FIGS. 5 and 6, a gate line 121 and gate electrodes 122 are formed on a substrate 103. The gate electrodes 122 can be formed in a single body united with the gate line 121. Also, the gate electrodes 122 can be formed on regions corresponding to the first and second thin film transistors T1 and T2. Moreover, the gate electrodes 122 can be formed to have a wider width than the gate line 121. Furthermore, each of the gate electrodes 122 can be formed in an octagon shape.

Since the gate electrode 122 is formed in the octagon shape, a formation region of the gate electrode 122, which is included into the pixel region allows light to be not transmitted, can be minimized. In accordance therewith, an aperture ratio of the pixel region can be enhanced.

The gate line 121 and the gate electrodes 122 can be formed from a gate metal. The gate metal can include at least one selected from a group which consists of titanium Ti, chromium Cr, nickel Ni, aluminum Al, platinum Pt, gold Au, tungsten W, copper Cu and molybdenum Mo.

A gate insulation film 105 can be formed on the substrate 103 provided with the gate line 121 and the gate electrodes 122. The gate insulation film 105 can be used to electrically insulate the gate line 121 and the gate electrodes 122 from different lines and electrodes which will be formed later. As such, the gate insulation film 105 must have a superior insulation property. To this end, the gate insulation film 105 can be formed from one of inorganic and organic materials. The inorganic material can include silicon nitride SiNx and silicon oxide SiOx. The organic material can include benzocyclobutene BCB.

Semiconductor layers 125 can be formed on the gate insulation film 105 opposite to the gate electrodes 122. One edge of the semiconductor layer 125 can be formed in the same shape as the gate electrode 122, but the other edge of the semiconductor layer 125 can be formed in a triangular pyramid. One edge of the semiconductor layer 125 of the first thin film transistor T1 being remote from the second thin film transistor T2 can be formed in the same shape as the gate electrode 122, but the other edge of the semiconductor layer 125 of the first thin film transistor T1 adjacent to the second thin film transistor T2 can be formed in the triangular pyramid.

The semiconductor layer 125 can include a channel region, a source region and a drain region. The source and drain regions can be formed in both ends of the channel region.

Data lines 131, source electrodes 132 and drain electrodes 133 can be formed on the gate insulation film 105 provided with the semiconductor layers 125.

The source electrode 132 can come in contact with the source region of the semiconductor layer 125. The drain electrode 133 can come in contact with the drain region of the semiconductor layer 125. The data lines 131 can be formed in a direction crossing the gate line 121.

The source electrode 132 can be formed in a single body united with the data line 131. Also, the source electrode can be formed in a half elliptical shape by being bent from the data line 131. Moreover, the source electrode 132 can be formed in an opposite shape to the gate electrode 122. Such a source electrode 132 can include a first source portion 132a, a second source portion 132b and a third source portion 132c.

The first source portion 132a can be formed in a parallel direction to the data line 131. The second source portion 132b is bent (or inclined) in such a manner as to make an acute angle with the data line 131. Also, the second source portion 132b can electrically connect the first source portion 132a to the data line 131. Similarly, the third source portion 132c is bent (or inclined) in such a manner as to make an acute angle with the data line 131. Also, the third source portion 132c can electrically connect the first source portion 132a to the data line 131.

The drain electrode 133 can be formed to face the source electrode 132 in the semiconductor layer 125. In other words, one end of the drain electrode 133 can face the source electrode 132. One end of the drain electrode 133 can include a first drain edge portion 133a, a second drain edge portion 133b and a third drain edge portion 133c.

The first drain edge portion 133a can be formed parallel to the first source portion 132a. The second drain edge portion 133b can be formed parallel to the second source portion 132b. The third drain edge portion 133c can be formed parallel to the third source portion 132c.

In other words, the edges of one end of the drain electrode 133 are formed parallel to the bent source electrode 133. As such, distances (or a gab) between the drain electrode 133 and the source electrode 132 can become uniform. In accordance therewith, the length of the channel region can be uniformly maintained.

In this way, the source electrode 132 is formed in a half elliptical shape by being bent from the data line 131, and one end of the drain electrode 133 can be formed in the opposite shape to the source electrode 132. As such, the thin film transistor according to the first embodiment can reduce the overlapping area between the gate electrode 122 and the drain electrode 133, unlike the related art thin film transistor with the shape of "I". Also, the parasitic capacitor Cgd existing between the gate and drain electrodes 122 and 133 can be reduced. In accordance therewith, the feed through voltage ΔVp can decrease. As a result, the image quality of the LCD device can be enhanced.

Moreover, the thin film transistor T according to the first embodiment forces a gap between the source and drain electrodes 132 and 133 on the semiconductor layer 125 to be no less than that of the related art thin film transistor with the shape of "I". As such, the thin film transistor according to the first embodiment can be formed to have a channel width of not less than that of the related art thin film transistor with the shape of "I". In accordance therewith, signal propagation speed proportion being proportioned to the channel width can be enhanced. The enhanced signal propagation property can allow the image quality to become higher.

The data line 131, the source electrode 132 and the drain electrode 133 can be formed from a data metal. The data metal can include at least one selected from a group which consists of titanium Ti, chromium Cr, nickel Ni, aluminum Al, platinum Pt, gold Au, tungsten W, copper Cu and molybdenum Mo.

An interlayer insulation film 107 can be formed on the gate insulation film 105 which is provided with the data lines 131, the source electrodes 132 and the data lines 133. The interlayer insulation film 107 can be used to electrically insulate the data lines 131, the source electrodes 132 and the drain electrodes 133 from different lines and electrodes which will be formed later. As such, the interlayer insulation film 107 must have a superior insulation property. To this end, the interlayer insulation film 107 can be formed from one of inorganic and organic materials. The inorganic material can include silicon nitride SiNx and silicon oxide SiOx. The organic material can include benzocyclobutene BCB.

Pixel contact holes 150 can be formed in the interlayer insulation film 107. The pixel contact holes penetrate through the interlayer insulation film 107 and expose the drain electrodes 133.

Pixel electrodes 140 can be formed on the interlayer insulation film 107 corresponding to the pixel regions. The pixel electrode 140 can be electrically connected to the drain electrode 133 via the pixel contact hole 150. Such pixel electrodes 140 can be formed from one of indium-tin-oxide, indium-zinc-oxide, indium-tin-zinc-oxide and alloys thereof.

Consequently, the first and second thin film transistors T1 and T2 can be formed in an alternate shape (or a half span shape, a half span shape) with respect to each other. Also, the first and second thin film transistor T1 and T2 can be connected to the same gate line.

In this manner, the first and second thin film transistors T1 and t2 are formed in the alternate shape (or the half turned shape or the half span shape) with respect to each other. As such, the formation region of a black matrix can be reduced and the aperture ratio of the LCD device can increase. In accordance therewith, the image quality of the LCD device can be enhanced.

Figure 7:
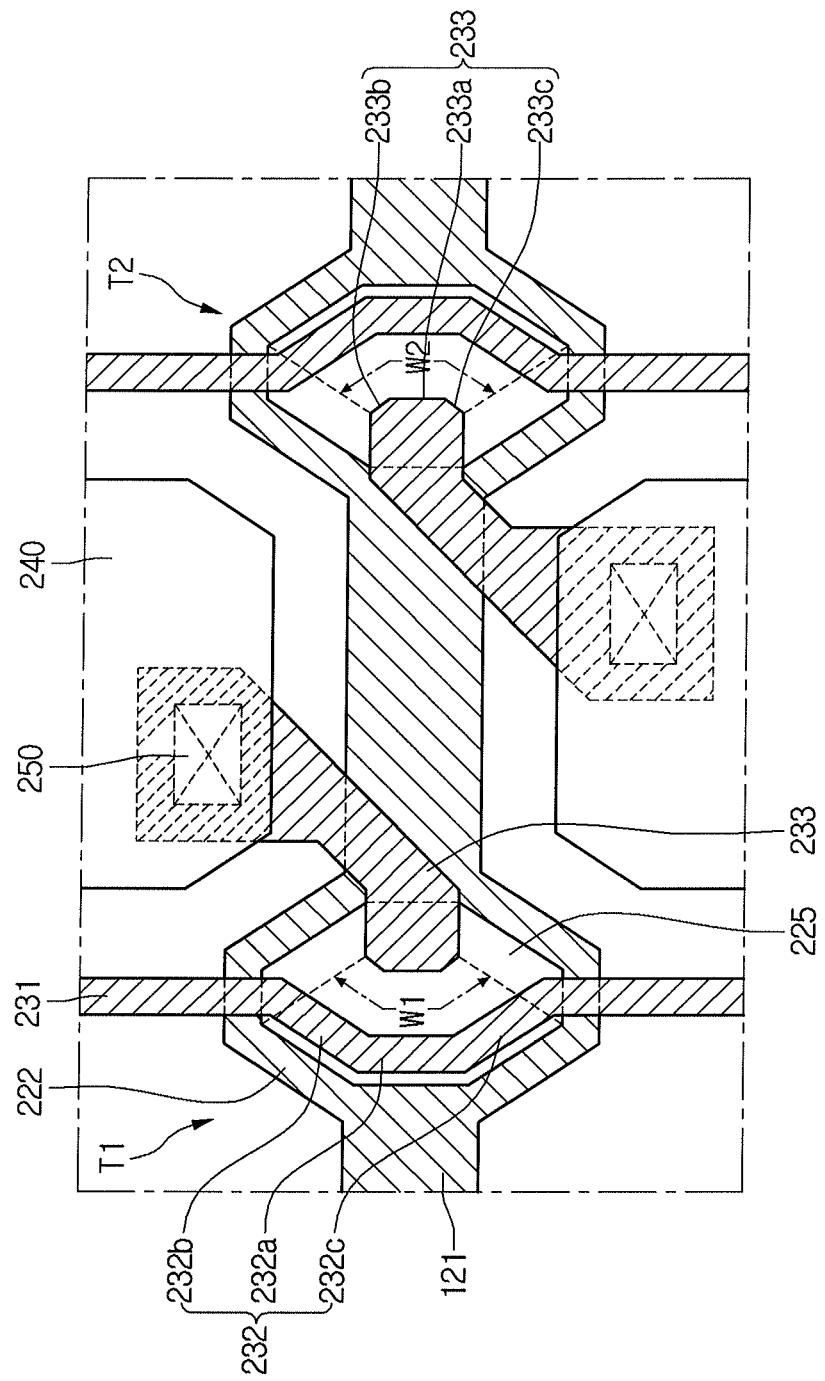
FIG. 7 is a planar view showing a thin film transistor substrate of an LCD device according to a second embodiment of the present disclosure.

FIG. 7 is a planar view showing a thin film transistor substrate of an LCD device according to a second embodiment of the present disclosure.

The thin film transistor substrate of the LCD device according to the second embodiment is the same configuration as that of the LCD device of the first embodiment with the exception of a different shaped semiconductor layer. As such, the components of the second embodiment having the same function and shape as those of the first embodiment will be referred to by the same reference numbers and names. Also, the description of the second embodiment overlapping with the first embodiment will be omitted.

Referring to FIG. 7, the thin film transistor substrate of the LCD device according to a second embodiment of the present disclosure includes a gate line 221 and data lines 231 crossing the gate line 221. Thin film transistors are formed at intersections of the gate and data lines 221 and 231. As examples of the thin film transistors, first and second thin film transistors T1 and T2 will be explained referring to FIG. 7.

Gate electrodes 222 are formed in the intersections of the gate and data lines 221 and 231. The gate electrodes 222 can be formed to each have a wider width than that of the gate line 221. Also, the gate electrode 222 can be formed in an octagon shape.

Semiconductor layers 225 can be formed on a gate insulation film (not shown) opposite to the gate electrodes 222. The semiconductor layer 225 can be formed in a smaller size than that of the gate electrode 222. Also, the semiconductor layer 225 can be formed in the same shape as the gate electrode 222.

Source and drain electrodes 232 and 233 can be formed on each of the semiconductor layer 225. The source electrode 232 can be formed in a single body united with the adjacent data line 231. Also, the source electrode 232 can be formed in a half elliptical shape by being bent from the data line 231.

The source electrode 232 can be formed parallel to adjacent edge line of the semiconductor layer 225. As such, the source electrode 232 can be formed on the semiconductor layer 225 even though a mask is misaligned in a photolithography process. In accordance therewith, the entire source electrode 232 can be used as an operation portion of the thin film transistor.

The semiconductor layer 225 can be formed in the octagon shape of being bilateral-symmetric about the data line 231. Also, the semiconductor layer of the first thin film transistor T1 can have the same shape and size as that of the second thin film transistor T2.

The first and second thin film transistors T1 and T2 can be formed in the half turned shape (or the alternated shape or the half span shape) with respect to each other. Also, the semiconductor layers of the first and second thin film transistors T1 and T2 are formed in the octagon shapes with the same size. As such, the channel width W1 of the first thin film transistor T1 and the channel width W2 of the second thin film transistor T2 can be the same size even though a mask is misaligned to the left, right, up or down direction at the formation of the source and drain electrodes 232 and 233.

Actually, the source and drain electrodes 232 and 233 are misarranged to the left, right, up or down direction within a tolerance process margin. Nevertheless, the channel width of the semiconductor layer formed between the source and drain electrodes 232 and 233 does not vary. As such, the first and second thin film transistors T1 and T2 can maintain the same channel width as each other.

In other words, the thin film transistors adjacent to each other can maintain the same channel width. Therefore, the deterioration of the image quality due to the non-uniform channel width can be prevented. As a result, the flicker noise generated in the image can be minimized.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A thin film transistor substrate comprising:
a plurality of gate lines and a plurality of data lines arranged to define a plurality of pixel regions including the first and the second pixel regions adjacent to a same gate line which is between the first and second pixel regions, are disposed between first and second parallel and adjacent data lines; and
a plurality of thin film transistors including each of first and second thin film transistors arranged alternately to each other in the same gate line so as to be connected to the same gate line and disposed along the same gate line which intersects respectively with the first and the second parallel adjacent data lines,
each of the first and the second thin film transistors includes:
a respective gate electrode connected to the same gate line;
a respective semiconductor layer on the same gate line;
a respective source electrode connected to the corresponding data line; and
a respective drain electrode in an opposite shape to the respective source electrode;
wherein respective the gate electrode and respective the semiconductor layer are overlapped in the corresponding data line.

2. The thin film transistor substrate of claim 1, wherein the semiconductor layers of the first and second thin film transistors are the same size.

3. The thin film transistor substrate of claim 1, wherein the gate electrode is in the same shape as and a larger size than the semiconductor layer.

4. The thin film transistor substrate of claim 1, wherein the gate electrode is disposed at an intersection of the gate line and the data line.

5. The thin film transistor substrate of claim 1, wherein the semiconductor layer is bilaterally symmetrical about the data line.

6. The thin film transistor substrate of claim 1, wherein the first and second thin film transistors have alternate shapes with respect to each other.

7. The thin film transistor substrate of claim 1, wherein
the source electrode is disposed in a single body united with the data line, and
the gate electrode is disposed in a single body united with the gate line.

8. The thin film transistor substrate of claim 1, wherein the semiconductor layer and the gate electrode are in an octagon shape.

9. The thin film transistor substrate of claim 1, wherein the source electrode is in a half elliptical shape by being bent from the data line.

10. The thin film transistor substrate of claim 9, wherein the drain electrode includes an end portion disposed in a parallel structure to the source electrode.

11. The thin film transistor substrate of claim 10, wherein the source electrode includes:
a first source electrode portion parallel to the data line;
a second source electrode portion inclined at an acute angle and configured to connect the data line to the first source electrode portion; and
a third source electrode portion inclined at the acute angle and configured to connect the data line to the first source electrode portion.

12. The thin film transistor substrate of claim 11, wherein the end portion of the drain electrode includes:
a first edge parallel to the first source electrode portion;
a second edge parallel to the second source electrode portion; and
a third edge parallel to the third source electrode portion.

13. A thin film transistor substrate comprising:
a plurality of gate lines and a plurality of data lines arranged to define a plurality of pixel regions in a direction crossing each other; and
a plurality of thin film transistors on the pixel regions include:
first thin film transistors in each of an odd-numbered columns arranged alternately with one another so as to be shared to an odd-numbered gate lines in a single pair and connected to the odd-numbered gate lines in a single pair; and
second thin film transistors in each of an even-numbered columns arranged alternately with one another so as to be shared to an even-numbered gate lines in a single pair and can be connected to the even-numbered gate lines in a single pair;

wherein the pixel regions are scanned in such a manner that the pixel regions of the odd-numbered columns are selected alternately with those of the even-numbered columns in two rows as the gate lines are sequentially enabled.

14. The thin film transistor substrate of claim 13, wherein each of the first and second thin film transistors includes:
a gate electrode connected to the gate line;
a semiconductor layer on the gate line in an octagon shape;
a source electrode connected to the data line; and
a drain electrode in an opposite shape to the source electrode.

15. The thin film transistor substrate of claim 14, wherein the semiconductor layers of the first and second thin film transistors are disposed in the same size.

16. The thin film transistor substrate of claim 14, wherein the gate electrode is in the same shape as and a larger size than the semiconductor layer.

17. The thin film transistor substrate of claim 14, wherein the gate electrode is at an intersection of the gate line and the data line.

18. The thin film transistor substrate of claim 14, wherein the source electrode is in a half elliptical shape by being bent from the data line.

19. The thin film transistor substrate of claim 18, wherein the drain electrode includes an end portion in a parallel structure to the source electrode.

20. The thin film transistor substrate of claim 14, wherein the semiconductor layer is bilaterally symmetrical about the data line.

* * * * *